(12) United States Patent
Yamatani

(10) Patent No.: US 8,785,893 B2
(45) Date of Patent: Jul. 22, 2014

(54) EXTREME ULTRAVIOLET LIGHT SOURCE AND POSITIONING METHOD OF LIGHT FOCUSING OPTICAL MEANS

(75) Inventor: Daiki Yamatani, Shizuoka (JP)

(73) Assignee: Ushio Denki Kabushiki Kaisha, Tokyo (JP)

(*) Notice: Subject to any disclaimer, the term of this patent is extended or adjusted under 35 U.S.C. 154(b) by 115 days.

(21) Appl. No.: 13/636,086

(22) PCT Filed: Mar. 2, 2011

(86) PCT No.: PCT/JP2011/054762
§ 371 (c)(1), (2), (4) Date: Sep. 19, 2012

(87) PCT Pub. No.: WO2011/114889
PCT Pub. Date: Sep. 22, 2011

(65) Prior Publication Data
US 2013/0009076 A1 Jan. 10, 2013

(30) Foreign Application Priority Data

Mar. 19, 2010 (JP) .................... 2010-064022

(51) Int. Cl.
*H01L 21/027* (2006.01)
*G03F 7/20* (2006.01)
*H05G 2/00* (2006.01)

(52) U.S. Cl.
CPC .......... *H01L 21/0274* (2013.01); *G03F 7/2004* (2013.01); *H05G 2/00* (2013.01)
USPC ................. 250/504 R; 250/492.1; 250/492.2; 378/34

(58) Field of Classification Search
CPC ...... G01B 11/272; G05D 3/12; H01L 21/027; G03F 7/20

USPC .......................................... 378/34; 250/504 R
See application file for complete search history.

(56) References Cited

U.S. PATENT DOCUMENTS

| 5,680,588 | A | * | 10/1997 | Gortych et al. | 430/30 |
| 6,501,534 | B1 | * | 12/2002 | Singh et al. | 355/55 |
| 7,312,459 | B2 | * | 12/2007 | Amemiya et al. | 250/372 |
| 2005/0184247 | A1 | * | 8/2005 | Ito et al. | 250/372 |

(Continued)

FOREIGN PATENT DOCUMENTS

| JP | 2006-128342 A | 5/2006 |
| JP | 2007-088267 A | 4/2007 |

(Continued)

OTHER PUBLICATIONS

International Search Report, maild Apr. 12, 2011.

(Continued)

*Primary Examiner* — Jack Berman
(74) *Attorney, Agent, or Firm* — Rader, Fishman & Grauer PLLC

(57) ABSTRACT

In an extreme ultraviolet ("EUV") light source apparatus, uneven angle distribution images of EUV light are detected prior to an adjustment function by a detector, and angle distribution image data is recorded. Movement data corresponding to the recorded angle distribution image data is also recorded. The movement data corresponds to a movement amount and direction that the optical focusing means is moved from a position in which the angle distribution is even to the position in which the corresponding uneven angle distribution image is obtained. For the adjustment, a current angle distribution property image is detected by the detector and is compared with the uneven angle distribution property image data stored, and image data which is most closely matched with the current angle distribution property is selected. The movement data that corresponds to the selected image data is read out, and the light focusing optical means is moved based thereon.

4 Claims, 4 Drawing Sheets

(56) References Cited

U.S. PATENT DOCUMENTS

2006/0091328 A1    5/2006    Kanazawa
2009/0072167 A1    3/2009    Kanazawa
2010/0123086 A1 *  5/2010    Yamatani .................. 250/393

FOREIGN PATENT DOCUMENTS

JP        2007-142361 A      6/2007
JP        2007142361 A *     6/2007
WO        WO-2005/101924 A1  10/2005

OTHER PUBLICATIONS

Written Opinion of International Search Authority of PCT/JP2011/054762, mailed Dec. 4, 2011.

* cited by examiner

EXTREME ULTRAVIOLET LIGHT SOURCE AND POSITIONING METHOD OF LIGHT FOCUSING OPTICAL MEANS

TECHNICAL FIELD

The present invention relates to an extreme ultraviolet light source apparatus, which emits ultraviolet ("EUV") light, and specifically relates to a positioning method of a light focusing optical means (light focusing mirror) provided in the EUV light source apparatus.

BACKGROUND ART

As semiconductor integrated circuits become microminiaturized and more highly integrated, shortening the wavelength of an exposure light source that is used in manufacturing the circuits is necessary, and an extreme ultraviolet light source apparatus (hereinafter also referred to as an EUV light source apparatus), which emits extreme ultraviolet light (hereinafter referred to as EUV (Extreme Ultra Violet) light) having a wavelength of 13-14 nm, especially a wavelength of 13.5 nm, has been developed (for example, refer to Patent Document 1) as a next generation exposure light source for semiconductor.

FIG. 4 is a diagram for simplified explanation of the EUV light source apparatus disclosed in the PATENT LITERATURE 1.

As shown in the figure, the EUV light source apparatus has a chamber 1, which is an electric discharge container. In the chamber 1, an electric discharge part 1a, in which a pair of disc-shaped electric discharge electrodes 2a and 2b is accommodated, and an EUV light focusing part 1b, in which a foil trap 5 and a collector mirror 6 are accommodated.

The pair of disc-shaped electrodes 2a and 2b is arranged in upper and lower parts as shown in FIG. 4, with an insulating member 2c interposed therebetween. A rotation axis 2e of a motor 2j is attached to the electric discharge electrode 2b, which is located at a lower portion as shown in FIG. 4.

The electric discharge electrodes 2a and 2b are connected to a pulse power supplying unit 3 through sliding elements 2g and 2h. A groove portion 2d is formed in a peripheral portion of the electric discharge electrode 2b, and solid material M (Li or Sn) for generating a high temperature plasma P is arranged in this groove portion 2d.

A gas discharge unit, which discharges gas from the electric discharge part 1a and the EUV light focusing part 1b, thereby forming a vacuum stage in the inside of the chamber 1 is referred to as 1c.

In the EUV light source apparatus, the material for a high temperature plasma, which is arranged at the groove portion of the electric discharge electrode 2b, is irradiated with an energy beam from an energy beam radiation device 4. The energy beam is, for example, a laser beam, and is emitted therefrom through the laser incident window 4a, and the solid material evaporates between the electric discharge electrodes 2a and 2b.

In this state, when pulse power is supplied between the electric discharge electrodes 2a and 2b from the pulse power supplying unit 3, electric discharge occurs between an edge part of the electric discharge electrode 2a and an edge part of the electric discharge electrode 2b, so that a plasma P is formed due to the high temperature plasma material M, whereby it is heated and excited by large current, which flows at time of electric discharge, and EUV light is emitted from this high temperature plasma P.

The emitted EUV light enters the EUV light focusing part 1b through a foil trap 5, is focused at a middle focal point f of a collector mirror 6 by the collector mirror 6, is emitted from an EUV light emitting mouth 7, and enters an exposure device 40 shown by dotted lines, which is connected to the EUV light source apparatus.

CITATION LIST

Patent Literature

Patent document 1: WO2005/101924

SUMMARY OF THE INVENTION

Technical Problem to be Solved by the Invention

However, there was a practical problem in such an EUV light source apparatus, as set forth below.

When the EUV light source apparatus is driven for lighting over a long time, the plasma P and the collector mirror 6 are shifted from each other in alignment thereof. For this reason, an Angular distribution property, which indicates an illuminance distribution state of EUV light at or beyond the middle focal point f, is deteriorated, so that the Angular distribution property may become uneven (asymmetrical). When the Angular distribution property becomes uneven, uneven exposure may arise on a workpiece in an exposure unit using EUV light.

For example, the following two causes, for which the Angular distribution property is deteriorated and becomes asymmetrical, can be thought of.

(1) When electric discharge electrodes are worn out with the passage of lighting drive time, the position of the plasma formed between the electric discharge electrodes changes, compared with that in a state of an early stage of lighting.

(2) The collector mirror 6 will be in a high temperature state due to heat emitted from the electric discharge electrodes 2a and 2b or the plasma P, whereby heat strain will be produced and the collector mirror 6 will be deformed.

As mentioned above, the Angular distribution property (an illuminance distribution state of the EUV light at or beyond a middle focal point) corresponds to a direction in which the plasma shifts from the alignment position (a position of a light focusing optical means when the light focusing optical means is set so that EUV light may be focused at a desired position) of the collector mirror 6 (light focusing optical means), the size thereof etc., so that the Angular distribution property is more deteriorated as the light focusing optical means 6 and the plasma are shifted from the alignment position.

That is, in order to correct unevenness (asymmetry) of the Angular distribution property to a uniformity (symmetry), while measuring the Angular distribution property, it is necessary to move the position of the light focusing optical means 6 in X axial directions (directions of an optical axis C: a horizontal direction in FIG. 4), Y axial directions (vertical directions in FIG. 4), Z directions (front and back side directions in FIG. 4), θz directions (rotation direction with respect to the Z axis), and/or θy directions (rotation direction with respect to the Y axis).

Currently, the above-mentioned operation is performed by slightly moving the position of the collector mirror 6, while an operator inserts a device for measuring an Angular distribution of EUV light at or beyond the focal point f and measures the Angular distribution property. The relation between the Angular distribution property change, and the moving direction of the collector mirror 6 and the amount of movement, is mastered by a worker's skill, so that the time required in an operation for adjusting a position of the collector mirror 6 in order to obtain an uniform Angular distribution property depends on workers, and a long time of several hours is required therefor in some cases.

Moreover, when the collector mirror 6 is replaced with a new one, similarly, the Angular distribution property is measured, and if it is uneven, the position adjustment operation of the collector mirror 6 must be performed so that it may become uniform. Therefore, a long time for replacement and the position adjustment of the collector mirror 6 is required in some cases.

The present invention is made in view of the above-mentioned background, and it is an object of the present invention to enable a less time consuming position adjustment of a collector mirror so as to acquire a uniform Angular distribution property, when the Angular distribution property is deteriorated at or beyond a middle focal point of an extreme ultraviolet light source apparatus whereby it becomes uneven (asymmetrical), or when the collector mirror is replaced, etc.

Solution Measure to Solve the Problem

Two or more of image data, which indicate an uneven Angular distribution property of EUV light that is reflected by light focusing optical means (collector mirror), are registered in advance in a control unit of an EUV light source apparatus, so as to be related to a moving direction and an amount of movement of the light focusing optical means for making the uneven Angular distribution property into an uniform Angular distribution property.

And if image data (Angular distribution property image data), which indicates the Angular distribution property in the present condition, is acquired by a device for measuring the Angular distribution property, this Angular distribution property image data is compared with two or more pieces of the uneven Angular distribution property image data stored in advance. And image data which is most closely matched with the acquired, measured and current Angular distribution property is selected from two or more pieces of the uneven Angular distribution property image data.

Next, data of the moving direction and the amount of movement of the light focusing optical means for making uniform Angular distribution property, which is saved so as to be related to the selected image data, is read out, whereby the light focusing optical means is moved based thereon.

Advantageous Effects of Invention

Advantageous effects set forth below can be acquired in the present invention.

Since the Angular distribution property image data in the present condition is obtained and compared with the uneven Angular distribution property image data, which has been registered in advance, and the moving direction and the amount of movement of a light focusing optical means, which are related to the most closely matched image data, and which are used for making uneven Angular distribution property into uniform Angular distribution property, are read out, whereby the light focusing optical means is moved based thereon, it is possible to adjust the position of the light focusing optical means for a short time, without depending on a degree of a worker's skill.

DESCRIPTION OF EMBODIMENTS

Figure 1:
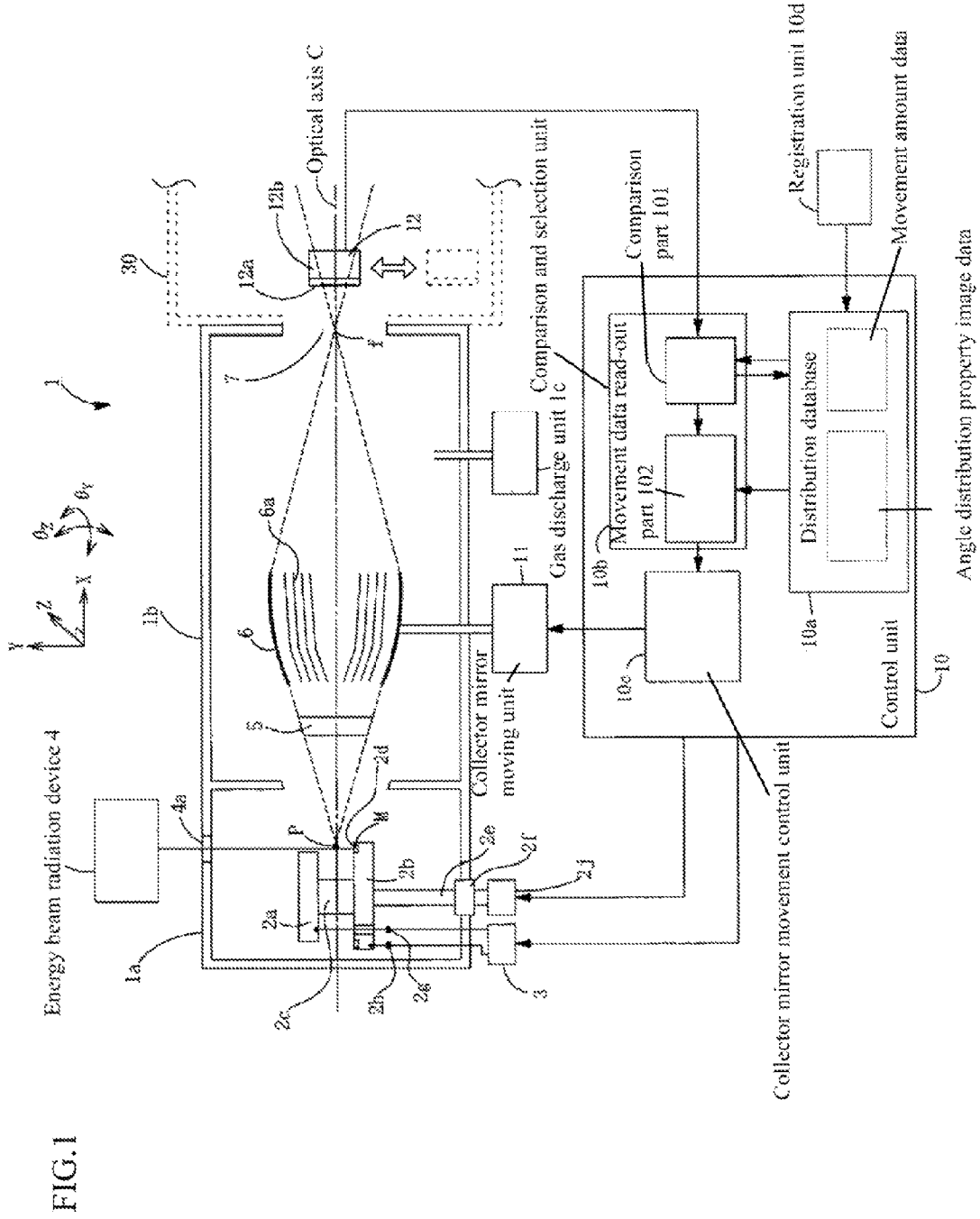
FIG. 1 is a diagram showing a schematic structure of the EUV light source apparatus according to an embodiment of the present invention.

FIG. 1 is a diagram showing a schematic structure of an EUV light source apparatus according to an embodiment of the present invention.

Figure 4:
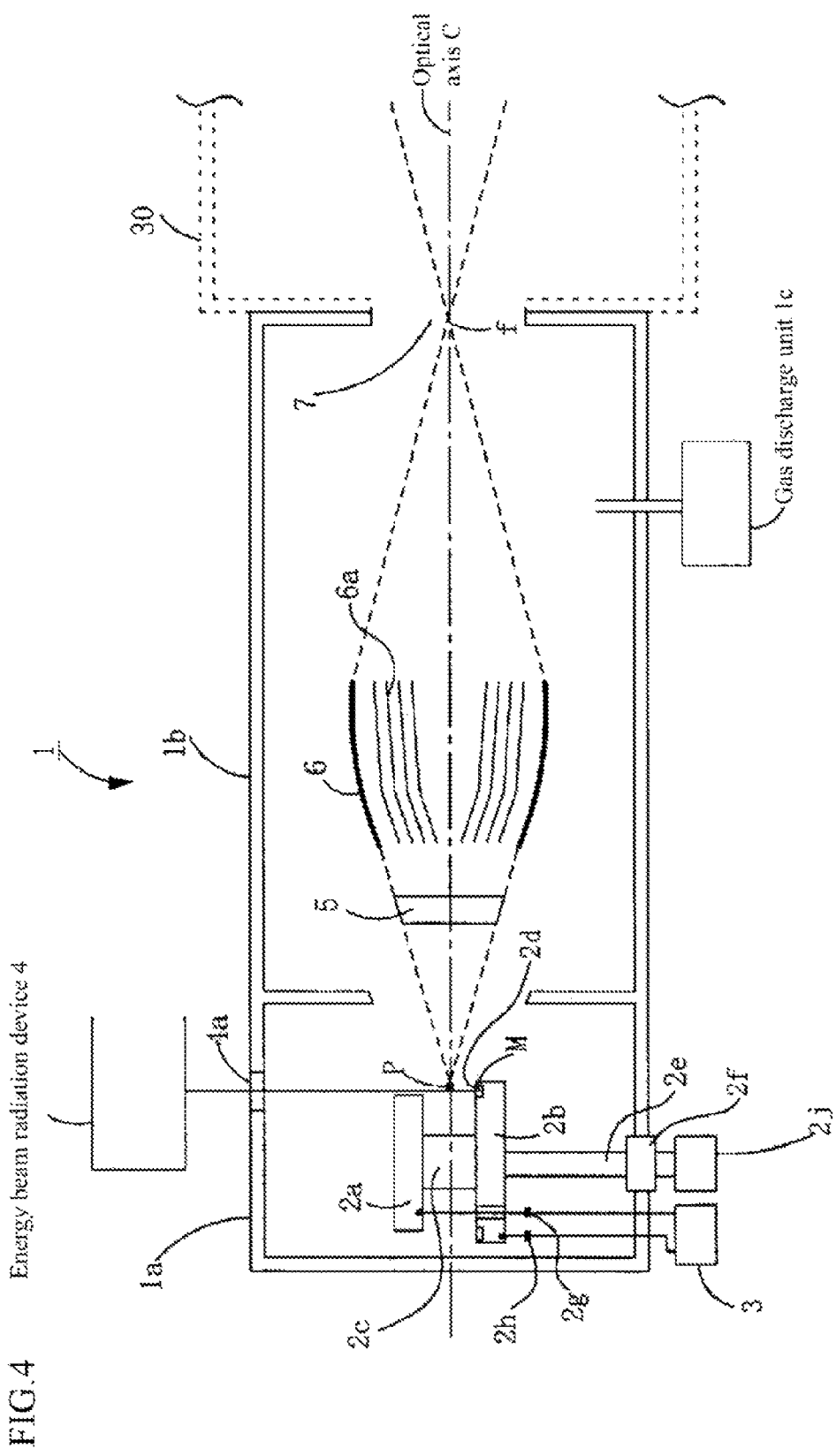
FIG. 4 It is a diagram for explaining an EUV light source apparatus.

The structure of the EUV light source apparatus is the same as that shown in FIG. 4, and comprises a chamber 1 made up of an electric discharge part 1*a*, which accommodates electric discharge electrodes 2*a* and 2*b*, and an EUV light focusing part 1*b*, which accommodates a foil trap 5 and a collector mirror (light focusing optical means) 6.

A gas discharge unit 1*c* for discharging air in the electric discharge part 1*a* and the EUV light focusing part 1*b* thereby forming a vacuum state inside the chamber 1 is provided in the chamber 1.

The pair of disc-shaped electric discharge electrodes 2*a* and 2*b* is arranged so as to face each other with an insulating member 2*c* interposed therebetween, and each center thereof is arranged on the same axis.

A rotation axis 2*e* of a motor 2*j* is attached to the electric discharge electrode 2*b* located on a lower part side in the drawing. As to the rotation axis 2*e*, the center of the electric discharge electrode 2*a* and the center of the electric discharge electrode 2*b* are located on the same axis as the rotation axis 2*e*. The rotation axis 2*e* is installed in the chamber 1 through a mechanical seal 2*f*.

The mechanical seal 2*f* permits rotation of the rotation axis 2*e*, while maintaining the reduced-pressure atmosphere in the chamber 1.

Sliding elements 2*g* and 2*h*, which are made up of, for example, carbon brushes etc. are provided on a lower part side of the electric discharge electrode 2*b*. The sliding element 2*g* is electrically connected to the electric discharge electrode 2*a* through a through-hole formed in the electric discharge electrode 2*b*. The sliding element 2*h* is electrically connected to the electric discharge electrode 2*b*.

A pulse power supplying unit 3 supplies pulse power to the electric discharge electrodes 2*a* and 2*b* through the sliding elements 2*g* and 2*h*, respectively.

A peripheral portion of each of the disc-shaped electric discharge electrodes 2*a* and 2*b* is formed in an edge shape.

Solid or liquid material M for generating a high temperature plasma is arranged at a groove portion 2*d* of the electric discharge electrode 2*b*. The material M is, for example, tin (Sn), or lithium (Li).

When electric power is supplied to the electric discharge electrodes 2*a* and 2*b* from the pulse power supplying unit 3, electric discharge occurs between the edge parts of both electrodes 2*a* and 2*b*. Since the peripheral portions of the electric discharge electrodes 2*a* and 2*b* become high in temperature by the electric discharge when the electric discharge occurs, the electric discharge electrodes 2*a* and 2*b* are made of high melting point metal such as tungsten, molybdenum, and tantalum etc.

The insulating member 2*c* is made of silicon nitride, aluminum nitride, diamond, etc. in order to secure insulation between the electric discharge electrodes 2*a* and 2*b*.

The chamber 1 is provided with an energy beam radiation device 4 for evaporating the material M by irradiating the material M with an energy beam. The energy beam emitted from the energy beam radiation device 4 is, for example, a laser beam.

The material M for a high temperature plasma arranged at the groove portion 2d of the electric discharge electrode 2b is irradiated with the laser beam emitted through a laser incident window 4a from the energy beam radiation device 4. Thereby, the material M is evaporated between the electric discharge electrodes 2a and 2b.

When pulse power is supplied from the pulse power supplying unit 3 between the electric discharge electrodes 2a and 2b in this status, electric discharge occurs between the edge part of the electric discharge electrode 2a and the edge part of the electric discharge electrode 2b. The large current that flows during the electric discharge raises the temperature of the material M, and a plasma P is formed by the high temperature plasma material M, resulting in heating excitation, whereby EUV light is emitted from this high temperature plasma P.

The foil trap 5 arranged in the EUV light focusing part 1b, is provided, in order to suppress debris, which is generated from the substance which forms the electric discharge electrodes or the material M for generating the high temperature plasma, from scattering towards the collector mirror 6.

Two or more small spaces divided by two or more thin boards which radially extend, are formed in the foil trap 5.

Light reflecting faces 6a for reflecting EUV light with wavelength of 13.5 nm emitted from the high temperature plasma, are formed in the collector mirror 6 arranged in the EUV light focusing part 1b.

The collector mirror 6 comprises two or more light reflecting faces 6a, which are arranged in a nested fashion without contacting each other. Each light reflecting face 6a is formed so as to make good reflection of extreme ultraviolet light whose incidence angle is 0-25 degrees, by precisely coating metal such as Ru (ruthenium), Mo (molybdenum), Rh (rhodium) etc., on a reflective face side of the base substance material which has a smooth face made of Ni (nickel) etc.

The light reflecting faces 6a of the collector mirror 6 are formed so that focal points f thereof may be in agreement with one another. The light that is focused by the collector mirror 6, is emitted from an EUV light emitting mouth 7 and enters an exposure device 30 (shown by dotted lines), which is connected to the EUV light source apparatus.

Moreover, the EUV light source apparatus has a control unit 10, which controls an operation of a motor 2d for rotating the electrodes 2a and 2b, and the pulse power supplying unit 3 for supplying electric power to the electrodes 2a and 2b, etc., and as described below, obtains a movement direction and an amount of movement of the collector mirror 6 based on image data of the measured Angular distribution property, whereby the collector mirror 6 is moved by the collector mirror moving unit 11.

An Angular distribution property measuring device 12, which measures the Angular distribution property of the EUV light focused at the focal point f, is placed on a back side of the focal point f. A movement mechanism, which is not shown, is attached to this Angular distribution property measuring device 12, and the Angular distribution property measuring device 12 is inserted in an optical path (as shown by solid lines in the drawing) at time of Angular distribution property measurement, and is retracted from the optical path during exposure processing (as shown by dotted lines in the drawing).

The Angular distribution property measuring device 12 is provided with a scintillator 12a which converts EUV light into visible light, and a CCD camera 12b for receiving the visible light converted by this scintillator 12a.

The CCD camera 12b receives the incident light and outputs image data which indicates the illuminance distribution of the received light. This image data is sent to the control unit 10 as Angular distribution property image data.

The collector mirror moving unit 11 for moving the collector mirror 6 in an X axial direction (a direction of an optical axis C: horizontal directions in FIG. 1), a Y axial direction (vertical directions in FIG. 1), a Z direction (front and back side directions in FIG. 1), a θz direction (rotation directions with respect to the Z axis), and a θy direction (rotation directions with respect to Y axis), is attached to the collector mirror 6, wherein an operation thereof is controlled by the control unit 10.

The control unit 10 can be formed by, for example, a processing unit such as a processor and a memory unit, and may control operation of the entire EUV light source apparatus (i.e. it may control the pulse power supplying unit 3 for supplying electric power to the electrodes 2a and 2b as described above, etc.) in addition to controlling the movement of the collector mirror 6 for making the Angular distribution property thereof uniform according to the present invention.

In order to control the movement of the collector mirror 6, the control unit 10 is equipped with a distribution database 10a, a comparison and selection unit 10b, and a collector mirror movement control unit 10c. Moreover, the distribution database 10a is provided with a registration unit 10d for registering image data etc.

The distribution database 10a is made up of the memory unit of the control unit 10, in which two or more pieces of Angular distribution property image data and movement data for moving the collector mirror 6 that is associated with each of the image data, are registered.

The comparison and selection unit 10b has a comparison part 101 and a movement data read-out part 102, wherein the comparison part 101 compares the Angular distribution property image data that is acquired by the Angular distribution property measuring device 12 with the image data that is stored in the distribution database 10a, in order to search the most closely matched image data in the distribution database 10a, and the movement data read-out part 102 reads out movement data that is associated with this image data. This movement data is sent to the collector mirror movement control unit 10c, and the collector mirror movement control unit 10c controls the collector mirror moving unit 11 based on the movement data, thereby moving the collector mirror 6.

Next, description of a position adjustment method of a collector mirror according to the present invention will be given below referring to FIGS. 1 and 2.

Figure 2:
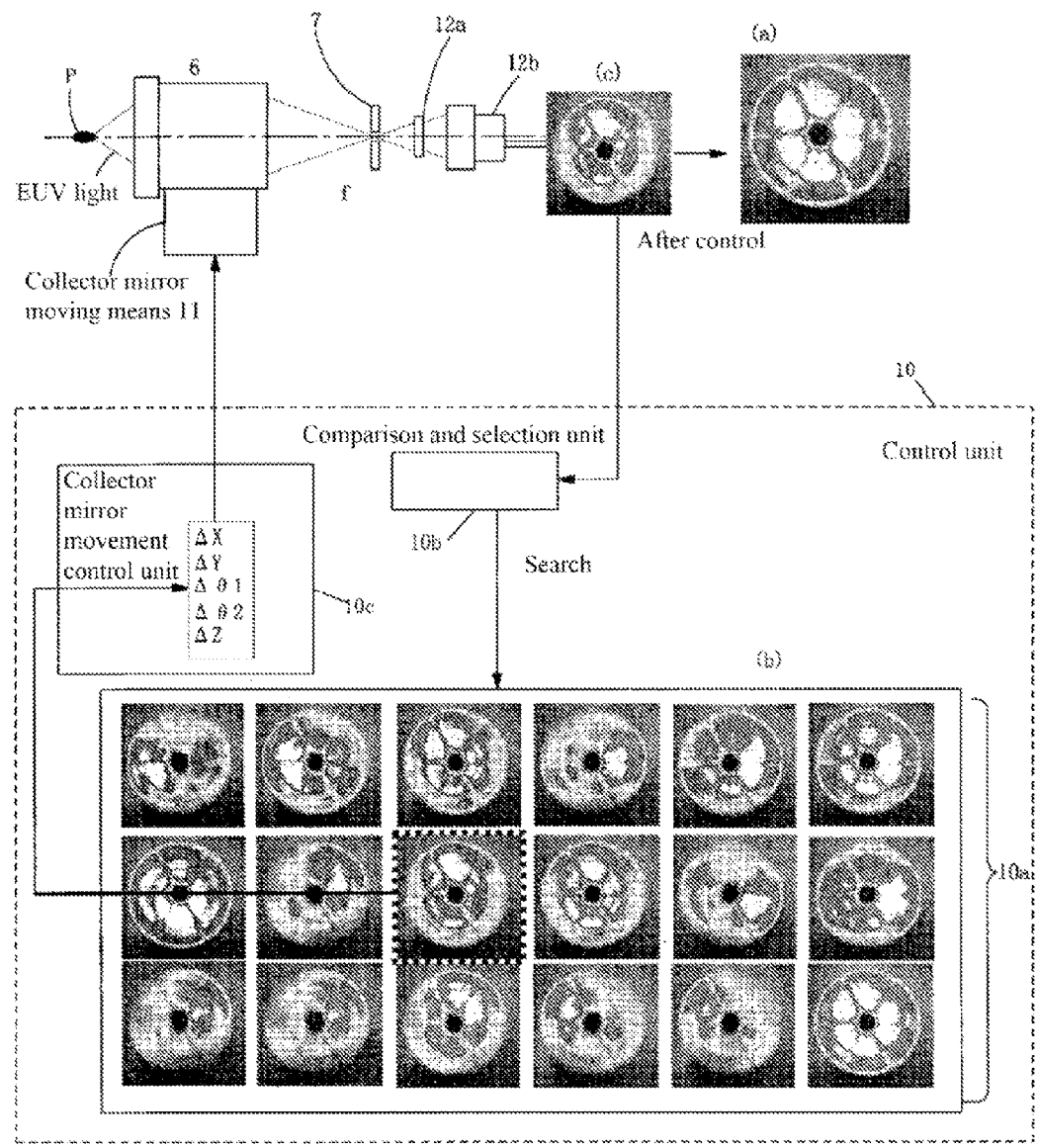
FIG. 2 It is a diagram for explaining control of movement of a collector mirror according to the present embodiment.

FIG. 2 is a diagram for explaining a movement control of the collector mirror according to the present embodiment, which shows: an example of the image data stored in the distribution database 10a, the collector mirror moving unit 11, the collector mirror 6, an aperture 7 (EUV light emission mouth 7), which is arranged at a focal position of EUV light, and the Angular distribution property measuring device 12, which is made up of the scintillator 12a and the CCD camera 12b.

First, as a step prior to a position adjustment of the collector mirror 6, image data of an uneven Angular distribution property reflected by the collector mirror is associated with a movement direction and an amount of movement of the collector mirror, for making the uneven Angular distribution property into uniform. Angular distribution property, and is registered (saved) from the registration unit 10d in the distribution database 10a of the control unit 10.

Specifically, the Angular distribution property measuring device 12 is inserted into an optical path in a state where EUV light is emitted and the collector mirror 6 is moved by operating the collector mirror moving unit 11 while looking at the image data obtained from the Angular distribution property measuring device 12, and the movement direction and the amount of movement thereof at that time are registered in the distribution database with the Angular distribution image data at that time.

FIG. 2 (a) shows an example of Angular distribution property image data which was measured by the Angular distribution property measuring device, where the illuminance distribution is approximately uniform. In the figure, a white portion shows the intensity of EUV light is high, and the illuminance of the EV light becomes lower from the white portions to gray portions and black portions. In the figure, the portion where the intensity of EUV light is high, is distributed almost uniformly on the circumference thereof. In addition, in the figure the high intensity portion appears to be divided into six areas, wherein the divisions show the shadow of a support member that supports each reflective face 6a of the collector mirror 6.

In this state, the collector mirror is moved in a certain direction by a certain amount (for example, A millimeters in the Z direction) by the collector mirror moving unit 11. Because it is moved from a state where the Angular distribution property is uniform, the illuminance distribution in the Angular distribution property image data, which is obtained from the Angular distribution property measuring device 12, will become uneven as shown, for example, in (c) of FIG. 2.

And the image data of the uneven Angular distribution property and the movement information that indicates that the Angular distribution property is moved by A millimeters in the X direction from the uniform state, are associated with each other and stored in the distribution database 10a of the control unit 10.

The operation, in which the movement information of the collector mirror 6 is associated with the uneven image data of this Angular distribution property and saved, is performed from the registration unit 10d connected to the control unit 10. The image data registered in such a way is represented as image data 1.

Then, the collector mirror 6 is returned to the state (alignment position) where the uniform Angular distribution property can be obtained, and the collector mirror is moved in a direction which is different from the previous one (for example, B degrees in a θy direction), and then Angular distribution property image data at the position is associated with the movement information that indicates that it is moved by B degrees in the θy direction from the state where the Angular distribution property is uniform, and saved. This is represented as image data 2.

Thus, uneven Angular distribution property image data associated with the movement information is registered (saved) for as many instances as possible in the distribution database 10a of the control unit 10. For example, 4000-5000 pieces of image data are saved in an actual apparatus.

FIG. 2 (b) shows an example of two or more pieces of image data having uneven Angular distribution property, which are registered in the distribution database 10a of the control unit 10 in this way. As described above, data of a movement direction and that of the amount of movement, which indicate in which direction and how much the Angular distribution property is moved from a uniform state, are associated with each of the image data and saved.

In this way, an operation of a position adjustment of the collector mirror 6 is performed after the image data of two or more uneven Angular distribution property states is registered.

For example, when the old collector mirror 6 is replaced with a new one and attachment thereof is completed, EUV light is emitted, the Angular distribution property measuring device 12 is inserted into the optical path, and the Angular distribution property (in the current condition) is measured in that state. The measured Angular distribution property image data is sent to the control unit 10. Here, it is assumed that the measured image data is like, for example, one shown in FIG. 2 (c).

In the comparison part 101 of the comparison and selection unit 10b, the measured image data (FIG. 2 (c)) is compared with two or more pieces of image data of uneven Angular distribution property saved in the distribution database 10a, whereby image data, which is the most closely matched therewith, is selected from among the image data of the distribution database 10a (FIG. 2 (b)).

This selection of the image data from this distribution database 10a is performed by using, for example, pattern matching. In general, such pattern matching is well known as the technique of measuring a degree of coincidence of registered image patterns and an observed image pattern. That is, image data whose score is the highest with respect to matching with the measured image data (FIG. 2 (c)), is selected.

When the image data that is the most closely matched with the measured image data FIG. 2 (c) is selected from the two or more pieces of the saved image data FIG. 2 (b) that have an uneven Angular distribution property, the movement data read-out part 102 of the comparison and selection unit 10b calls up the saved movement information which has been associated with that image data.

As described above, the movement information of the collector mirror 6 was previously associated with the called-up image data and saved. The associated and saved movement information is information of the direction and magnitude of the movement of the collector mirror 6 from the uniform Angular distribution property. As shown in FIGS. 1 and 2, horizontal directions in the figure are represented as X, vertical directions in the figure are represented as Y, front and back side directions in the figure are represented as Z, a rotation with respect to a Z axis is represented as θz, a rotation with respect to a Y axis is represented as θy, the amounts of movement in the X, Y, and Z directions are $\triangle X$, $\triangle Y$, and $\triangle Z$, the amount of rotation with respect to the z axis is $\triangle \theta z$, and the amount of rotation with respect to the Y axis is $\triangle \theta y$.

Therefore, if the collector mirror 6 is moved in an opposite direction with respect to the position information saved and associated with the selected image data that has an uneven Angular distribution property, image data measured by the Angular distribution property measuring device 12 becomes similar to that of the uniform. Angular distribution property.

For example, if the measured image data is very similar to the image registered as the image data 1 from the example discussed above, the control unit 10 makes the collector mirror moving unit 11 moves the collector mirror by −A millimeters in the Z direction. Moreover, if the measured image data is very similar to the image registered as the image data 2, the collector mirror is moved in the θy direction by −B degrees.

In such a way, after the collector mirror is moved, the Angular distribution property of EUV light is measured by the Angular distribution property measuring device 12 again so that image data may be acquired.

And the newly acquired Angular distribution property image data is again compared with each of the image data of the distribution database 10a, so that image data that is most closely matched therewith is selected, and similarly to the above, the collector mirror 6 is moved based on the movement information of the collector mirror 6 that is associated with that image data.

By repeating this several times, the collector mirror 6 is adjusted at a position where the uniform Angular distribution property is obtained. It is desirable to perform the measurement of the Angular distribution property of EUV light and such a position adjustment of the collector mirror at a frequency of once a day (approximately every 100 million shots).

According to the present embodiment, since a position adjustment of the collector mirror 6 is automatically performed based on the image data that is saved in the control unit 10 in advance and the movement information of the collector mirror 6 that is saved so as to be associated with the image data, it becomes possible to perform an operation of position adjustment thereof in a short time of from 20 seconds to 30 seconds, without depending on a degree of a worker's skill.

Moreover, thus, there are also advantages in study of a degree of matching with the saved image, as set forth below.

The collector mirror 6 has the two or more reflective faces 6a, as described above, and when the reflection ratio of a specific reflective face among the reflective faces 6a decreases, only part of the Angular distribution will change, but it may not be visually noticed sometimes. However, since the degree of matching with the saved image such as pattern matching decreases, a problem of the collector mirror 6 can be found promptly.

Moreover, the position adjustment of this collector mirror can be performed when in the EUV light source apparatus, the position of the foil trap 5 is shifted so that the angle property of the EUV light is deteriorated due to the position shift, or when the reflection ratio of a specific reflective face decreases so that the angle property of EUV light is deteriorated in the collector mirror 6 which has two or more reflective faces 6a. In such a case, although the angle property of EUV light cannot be returned to a uniform state as in an initial stage, it is possible to correct it so as to be in such a uniform state as much as possible.

Although position adjustment of the collector mirror in the EUV light source apparatus that emits EUV light due to electric discharge between electrodes is explained as an example in the above-mentioned embodiment, the present invention may be used for a position adjustment of the collector mirror of EUV light source apparatus in which EUV light is emitted by irradiating the dropped material for generating high temperature plasma with a high output energy beam.

Figure 3:
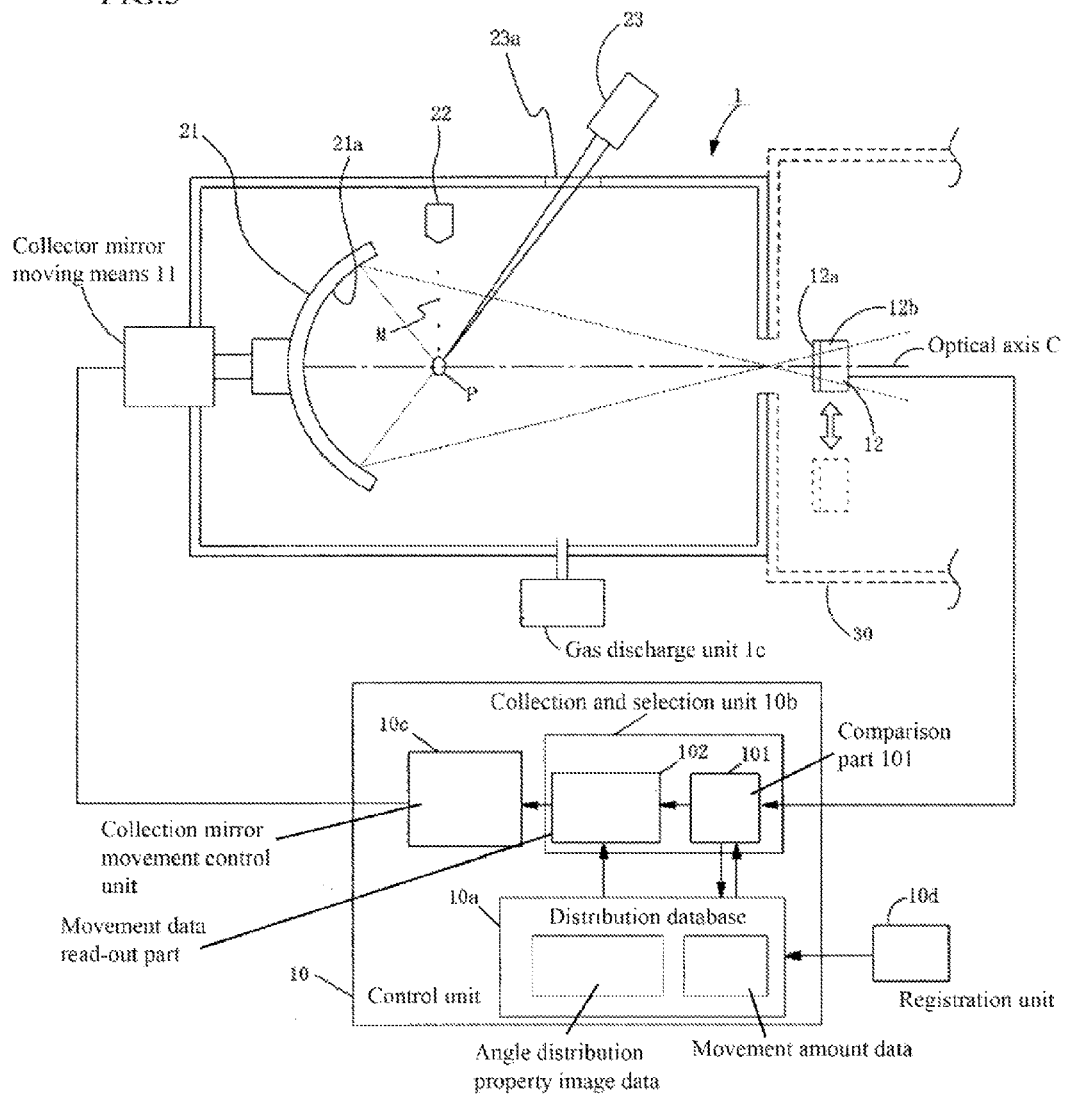
FIG. 3 It is a diagram showing a schematic structure in a case where the present invention is applied to an EUV light source apparatus which does not have electric discharge electrodes.

FIG. 3 shows a schematic structure in the case where the present invention is applied to an EUV light source apparatus which does not have electric discharge electrodes.

The EUV light source apparatus has a chamber 21 accommodating a collector mirror 21, which is a light focusing optical means. A light reflecting face 21a, which reflects EUV light with a wavelength of 13.5 nm emitted from a high temperature plasma, and focuses that light at a focal point f, is formed on the collector mirror 21.

A gas discharge unit 1c for forming a vacuum state inside the chamber 1 is provided in the chamber 1.

The EUV light source apparatus is equipped with a material supplying unit 22, which drops (places a drop of) and supplies the liquid or solid material M for generating high temperature plasma, on a light reflecting face 21a side of the collector mirror 21. The material M is, for example, tin (Sn), or lithium (Li).

The EUV light source apparatus has a high output laser apparatus 23, which irradiates the material M supplied by the material supplying unit 22, with a laser beam with very high energy.

A laser beam, which has very high energy, is emitted through a laser incident window 23a from a high output laser apparatus 23 to the material M for high temperature plasma, which is supplied to the light reflecting face 21a side of the collector mirror 21 by the material supplying unit. Thereby, the material M becomes a high temperature plasma, and emits EUV light with wavelength of 13.5 nm. The EUV light emitted from the high temperature plasma is reflected by the light reflecting face 61a of the collector mirror 21 and is focused at a focal point f.

As described above, an Angular distribution property measuring device 12, which measures the Angular distribution property of the EUV light focused at the focal point f, is provided, on a back side of the focal point f. This Angular distribution property measuring device 12 comprises a scintillator 12a and a CCD camera 12b, as described above, is inserted into an optical path (position of solid lines in the figure) during Angular distribution property measurement, and is retracted from an optical path (a position of dotted lines in the figure) during exposure processing.

The Angular distribution property measuring device 12 outputs Angular distribution property image data which indicates illuminance distribution, and the image data is sent to a control unit 10.

A collector mirror moving unit 11, which moves the collector mirror 6, is installed in the collector mirror 21, and an operation thereof is controlled by the control unit 10.

The control unit 10 is equipped with a distribution database 10a, a comparison and selection unit 10b, and a collector mirror movement control unit 10c, wherein image data etc. is registered in the distribution database 10a from the registration unit 10d.

Two or more pieces of Angular distribution property image data and movement data associated with each of the image data, for moving the collector mirror 6, are registered in the distribution database 10a, and the comparison and selection unit 10b compares the Angular distribution property image data acquired by the Angular distribution property measuring device 12 in the comparison part 101 with the image data stored in the distribution database 10a, thereby selecting image data that is the most closely matched therewith in the distribution database 10a, and the movement data associated with that image data is read out by the movement data readout part 102. The movement data is sent to the collector mirror movement control unit 10c, and the collector mirror movement control unit 10c controls the collector mirror moving unit 11 based on the movement data, thereby moving the collector mirror 21.

REFERENCE SIGNS LIST

1 Chamber
1a Electric discharge unit
1b EUV light collecting unit
2a and 2b Electric discharge electrodes
2c Insulating member
3 Pulse power supplying unit
4 Energy beam radiation device
5 Foil trap
6 Collector mirror 10 Control unit
10a Distribution database
10b Comparison and selection unit
10c Collector mirror movement control unit
11 Collector Mirror moving unit
12 Angular distribution property measuring device
12a Scintillator
12b CCD camera
21 Collector mirror
22 Material supplying unit
23 High output laser apparatus
30 Exposure device
C Optical axis
M Material
P Plasma

The invention claimed is:

1. An extreme ultraviolet light source apparatus comprising:
- an extreme ultraviolet light source;
- a light focusing optical means, which reflects and focuses light emitted from the light source;
- a light focusing optical means moving unit, which moves the light focusing optical means;
- an Angular distribution property measurement unit, which receives light reflected by the light focusing optical means, and which obtains Angular distribution property image data; which is image data indicating a direction of shift from an alignment position of the light focusing optical means, and an amount thereof, as a degree of unevenness of illuminance distribution,
- a control unit, which controls the light focusing optical means moving unit based on the Angular distribution property image data, so as to move the light focusing optical means, wherein the control unit includes:
  - a memory unit for storing two or more pieces of Angular distribution property image data in which illuminance distribution measured in advance is uneven, and a movement direction and an amount of movement, which are associated with the Angular distribution property image data, and which are used to move a position of the light focusing optical means when Angular distribution property image data indicating uneven illuminance distribution is obtained, to a position where Angular distribution property image data indicating uniform illuminance is obtained,
  - a comparison and selection unit, which:
    - compares current Angular distribution property image data measured by the Angular distribution property measurement unit with Angular distribution property image data saved in the memory unit in which illuminance is uneven,
    - selects Angular distribution property image data that is the most closely matched in a shape of an Angular distribution property to the current Angular distribution property image data, from two or more pieces of the saved Angular distribution property image data, and
    - reads out the saved movement direction and amount of movement of the light focusing optical means that are associated with the selected Angular distribution property image data, and
  - a light focusing optical means movement control unit which controls the light focusing optical means moving unit so as to move the light focusing optical means based on the saved movement direction and amount of movement of the light focusing optical means that are associated with the Angular distribution property image data read out by the comparison selection unit.

2. A light focusing optical means position adjusting method of an extreme ultraviolet light source apparatus including an extreme ultraviolet light source and a light focusing optical means that reflects and focuses light emitted from the light source, comprising the following steps of:
- a step of associating two or more pieces of Angular distribution property image data in which an illuminance distribution is uneven, with Angular distribution property image data in advance and obtaining a movement direction and an amount of movement for moving a position of the light focusing optical means when Angular distribution property image data exhibiting uneven illuminance distribution is obtained, to a position where Angular distribution property image data exhibiting uniform illuminance, is obtained; and
- a step of measuring a current Angular distribution property and thereby acquiring Angular distribution property image data;
- a step of comparing the obtained current Angular distribution property image data with two or more pieces of uneven Angular distribution property image data, which are acquired in advance, and selecting Angular distribution property image data that is the most closely matched in a shape of an Angular distribution property with the current Angular distribution property image data, from the two or more pieces of uneven Angular distribution property image data; and
- a step of moving the light focusing optical means based on the movement direction and the amount of movement of the light focusing optical means, associated with the selected Angular distribution property image data.

3. An extreme ultraviolet light source apparatus comprising:
- an extreme ultraviolet light source;
- a light focusing optical means, which reflects and focuses light emitted from the light source;
- a light focusing optical means moving unit, which moves the light focusing optical means;
- an angle distribution property measurement unit, which receives light reflected by the light focusing optical means, and which obtains angle distribution property image data;
- a control unit, which controls the light focusing optical means moving unit based on the angle distribution property image data, so as to move the light focusing optical means, wherein the control unit includes:
  - a memory unit for storing two or more sets of data, each set comprising (i) given angle distribution property image data in which illuminance distribution measured in advance is uneven, and (ii) movement direction and amount data that are associated with the given angle distribution property image data, wherein the movement direction and amount data are used to move a position of the light focusing optical means when angle distribution property image data indicating uneven illuminance distribution is obtained, to a position where angle distribution property image data indicating uniform illuminance is obtained,
  - a comparison and selection unit, which:
    - compares current angle distribution property image data measured by the angle distribution property measurement unit with angle distribution property image data saved in the memory unit in which illuminance is uneven, selects angle distribution property image data saved in the memory unit that is the most closely matched in a shape of an angle distribution property to the current angle distribution property image data, and reads out the saved movement direction and amount data that are associated with the selected angle distribution property image data, and a light focusing optical means movement control unit which controls the light focusing optical means moving unit so as to move the light focusing optical means based on the saved movement direction and amount data read out by the comparison selection unit.

4. A light focusing optical means position adjusting method of the extreme ultraviolet light source apparatus according to claim 3, comprising the following steps of:

a first step of associating two or more pieces of the angle distribution property image data in which illuminance distribution is uneven with corresponding the movement direction and amount data, wherein the movement direction and amount data corresponds to a movement direction and amount that the light focusing optical means was moved from a position where an angle distribution property image data in which illuminance is uniform is obtained to a position in which the respective angle distribution property image data in which illuminance distribution is uneven is obtained; and a second step of measuring the current angle distribution property and thereby acquiring angle distribution property image data;

a third step of comparing the current angle distribution property image data obtained in the second step with two or more pieces of uneven angle distribution property image data, which are acquired in advance and associated with movement direction and amount data in the first step, and selecting angle distribution property image data that is the most closely matched in a shape of an angle distribution property with the current angle distribution property image data, from the two or more pieces of uneven angle distribution property image data; and a fourth step of moving the light focusing optical means based on the movement direction and the amount data associated with the selected angle distribution property image data.

* * * * *